(12) United States Patent
Meagley et al.

(10) Patent No.: US 8,513,111 B2
(45) Date of Patent: Aug. 20, 2013

(54) FORMING SEMICONDUCTOR STRUCTURES

(75) Inventors: Robert P. Meagley, Beaverton, OR (US); Kevin P. O'Brien, Portland, OR (US); Tian-An Chen, Phoenix, AZ (US); Michael D. Goodner, Hillsboro, OR (US); James Powers, Aloha, OR (US); Huey-Chiang Liou, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 859 days.

(21) Appl. No.: 11/485,078

(22) Filed: Jul. 12, 2006

(65) Prior Publication Data

US 2006/0255432 A1    Nov. 16, 2006

Related U.S. Application Data

(63) Continuation of application No. 10/353,506, filed on Jan. 28, 2003, now abandoned.

(51) Int. Cl.
*H01L 23/58* (2006.01)

(52) U.S. Cl.
USPC ............................. 438/619; 438/637

(58) Field of Classification Search
USPC ................... 438/618–642, E21.495
See application file for complete search history.

(56) References Cited

U.S. PATENT DOCUMENTS

| | | | | |
|---|---|---|---|---|
| 5,155,053 | A * | 10/1992 | Atkinson | 438/577 |
| 5,266,424 | A * | 11/1993 | Fujino et al. | 430/5 |
| 5,950,101 | A * | 9/1999 | Yano et al. | 438/618 |
| 6,159,842 | A | 12/2000 | Chang et al. | |
| 6,603,139 | B1 * | 8/2003 | Tessler et al. | 257/40 |
| 6,610,593 | B2 * | 8/2003 | Kohl et al. | 438/623 |
| 6,652,922 | B1 | 11/2003 | Forester et al. | |
| 6,770,505 | B1 * | 8/2004 | Chiesl | 438/50 |
| 2004/0266167 | A1 * | 12/2004 | Dubin et al. | 438/619 |

\* cited by examiner

*Primary Examiner* — Cuong Q Nguyen
(74) *Attorney, Agent, or Firm* — Trop, Pruner & Hu, P.C.

(57) ABSTRACT

A semiconductor structure may be covered with a thermally decomposing film. That film may then be covered by a sealing cover. Subsequently, the thermally decomposing material may be decomposed, forming a cavity.

3 Claims, 4 Drawing Sheets

FORMING SEMICONDUCTOR STRUCTURES

CROSS-REFERENCE TO RELATED APPLICATIONS

This application is a continuation of U.S. patent application Ser. No. 10/353,506, filed on Jan. 28, 2003 now abandoned.

BACKGROUND

This invention relates generally to semiconductor structures.

A complementary metal oxide semiconductor (CMOS) device is generally a delicate electronic structure formed by a combination of lithographic and etching techniques that allow the device to be formed and exist in a microscopically clean, contamination free environment with precisely controlled physical properties to ensure reliable and efficient high speed operation. As a result, there is a need to control the dielectric constant of materials used to separate the electronic components and interconnections within the device.

To this end, an interlayer dielectric (ILD) material is deposited around the structures (transistors, passives, etc.) and between the layers of interconnections that make up the CMOS device for the purpose of establishing a dielectric constant. The dielectric constant affects the speed with which signals may propagate through the interconnection of the device.

While many dielectric materials have been studied, for the lowest dielectric constants, increasing amounts of void space and hence air have been incorporated within ILD materials. Indeed, true air gaps have been engineered into the devices directly to optimize the lowest effective dielectric constants. Air gap structures may be formed and encapsulated to protect such structures from the deleterious effects of environmental contamination.

Similarly, in a variety of other circumstances, it may be desirable to form air gap structures in various microelectronic, micromechanical, microbiological, and microoptical systems, as well as, microelectromechanical system (MEMS) device.

Thus, there is a need to make airgaps in semiconductor structures.

DETAILED DESCRIPTION

Figure 1:
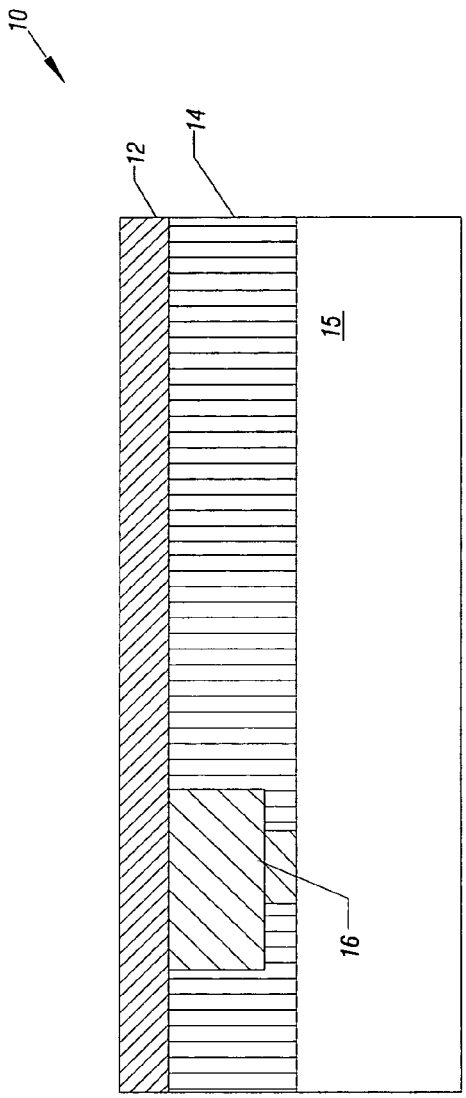
FIG. 1 is an enlarged cross-sectional view in accordance with one embodiment of the present invention.

Referring to FIG. 1, a semiconductor wafer 15 may have a thermally decomposing sacrificial layer 14 formed thereon. Defined within the layer 14 may be an interconnect 16 in one embodiment of the present invention. For example, the interconnect may be a copper interconnect in accordance with the dual damascene process. A porous etch stop capping layer 12 may be formed over the entire structure.

In some embodiments, the structure 10 may be a portion of a complementary metal oxide semiconductor (CMOS) integrated circuit. In other embodiments, it may be a portion of a microelectromechanical system.

The layer 14 may be driven off by heating the structure 10 after the capping layer 12 has been deposited on the surface of the polymer. The capping layer 12 can also serve as an etch stop for the creation of the next layer. If the layer 12 is porous, the thermally decomposed sacrificial layer 14 may be driven off without removing the layer 12. However, in other embodiments, apertures of any type may be formed in the layer 12 as desired.

Figure 2:
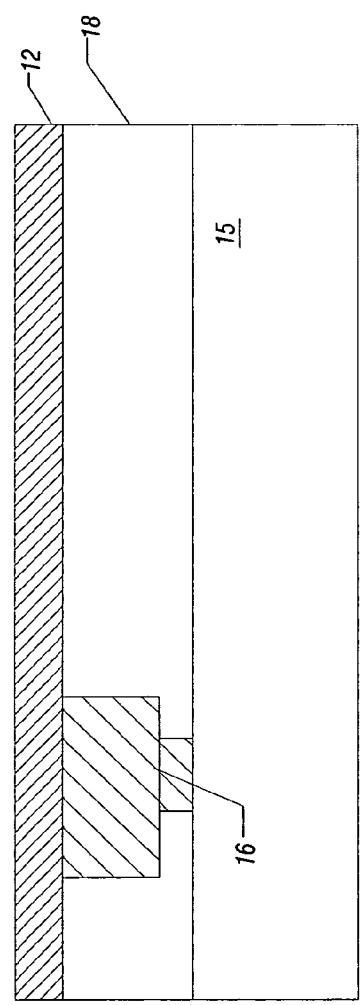
FIG. 2 is an enlarged cross-sectional view of a subsequent stage of manufacturing in accordance with one embodiment of the present invention.

As a result of the thermally driven decomposition and removal material of the forming the layer 14, an air gap region, pocket, or cavity 18 of low dielectric constant may be formed as shown in FIG. 2. Any technique for heating the layer 14 can be used, including baking or exposure to infrared or other energy sources.

Advantageously, the sacrificial layer 14 may be made of a material that may be decomposed by temperatures greater than those normally encountered during conventional semiconductor fabrication processes. A film that decomposes at relatively high temperatures (e.g., greater than about 260° C.) into smaller molecular weight effluents is advantageous. Advantageously, the decomposing film exhibits a high decomposition temperature and generally lower molecular weight byproducts on decomposition so that those byproducts can diffuse away through the layer 12.

The following chart provides a list of components and their thermal decomposition temperatures (Td):

| Polymer Basis or Family | Td |
|---|---|
| Polypropylene oxide (PPO) | 325-375 C. |
| Polymethylstyrene (PMS) | 350-375 C. |
| Polycaprolactone | 325 C. |
| Polycarbonate | 325-375 C. |
| Polyamideimide (PAI) | 343 C. |
| Polyamide-6,6 (Nylon 6/6) | 302 C. |
| Polyphthalamide (PPA, Amodel) | 350 C. |
| Polyetherketone (PEK) | 405 C. |
| Polyethretherketone (PEEK) | 399 C. |
| Polybutyllene terephthalate (PBT) | 260 C. |
| Polyethyllene terephthalate (PET) | 300 C. |
| Polystyrene (PS) | 260 C. |
| syndiotactic-Polystyrene (syn-PS) | >320 C. |
| Polyphenylene Sulfide (PPS) | 332 C. |
| Polyether Sulfone (PES) | 400 C. |

In accordance with another embodiment of the present invention, the layer 12 may be sufficiently porous to facilitate the exhaustion of the decomposed sacrificial layer 14 upon heating. A thin layer of hydrogen silsesquioxane (HSQ) or methylsilsesquioxane (MSQ) spin-on glass (SOG) may be utilized as the capping layer 12. After being cured, the HSQ or MSQ layer 14 may be exposed to electron beam or plasma conditions to densify the HSQ or MSQ film to be like a silicon dioxide film.

In some cases, a silicon dioxide chemical vapor deposition layer may be applied as an option to seal all remaining pores in the HSQ or MSQ film for subsequent metal interconnect processes. The deposited silicon dioxide layer may enhance the mechanical properties of the HSQ or MSQ layer and/or seal the remaining pores in the HSQ or MSQ films.

In some embodiments, the stress that is caused on the layer 12 during decomposition may be reduced. HSQ or MSQ may be sufficiently porous to enhance the ability of the thermally decomposing polymers to diffuse out of the air gap pocket or cavity 18, through the layer 12, without building up pressure to excessively deform the layer 12. The layer 12 performance may be comparable to silicon dioxide films after electron beam or plasma treatment of the layer 12. In some cases the mechanical performance of the layer 12 may be enhanced by forming a sealing material, such as deposited silicon dioxide, on top of the HSQ/MSQ layer 12.

In some cases the receiving surface may be hydrophilic while the polymer decomposing film such as those described herein may be relatively hydrophobic. Because of the energy mismatch, when the decomposing film is applied over surface irregularities, such as trenches, there may be incomplete filling of those trenches or bridging.

As a result, it is desirable to energy match the decomposing film to the underlying surface. In other words, if the underlying surface or the polymer are not both hydrophilic or both hydrophobic, it may be desirable to convert one of the surfaces to energy match the other.

Figure 3:
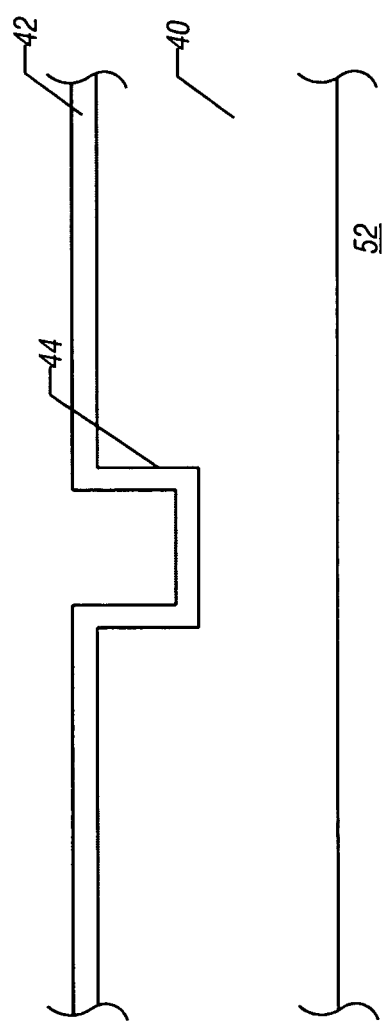
FIG. 3 is an enlarged cross-sectional view of another embodiment of the present invention.

In the case of hydrophobic decomposing polymers such as those described previously herein, it may be most feasible to simply modify a hydrophilic surface to which they are to be applied to make that surface hydrophobic. Thus, referring to FIG. 3, a substrate 52 may be covered by an oxide 40 having a trench 44 formed therein. A surface coating 42 may be applied to the oxide 40 to present an energy match with the decomposing film that may be applied. The film 42 may convert the hydrophilic material 40 to present a more hydrophobic surface which energy matches with the applied decomposing film.

Figure 4:
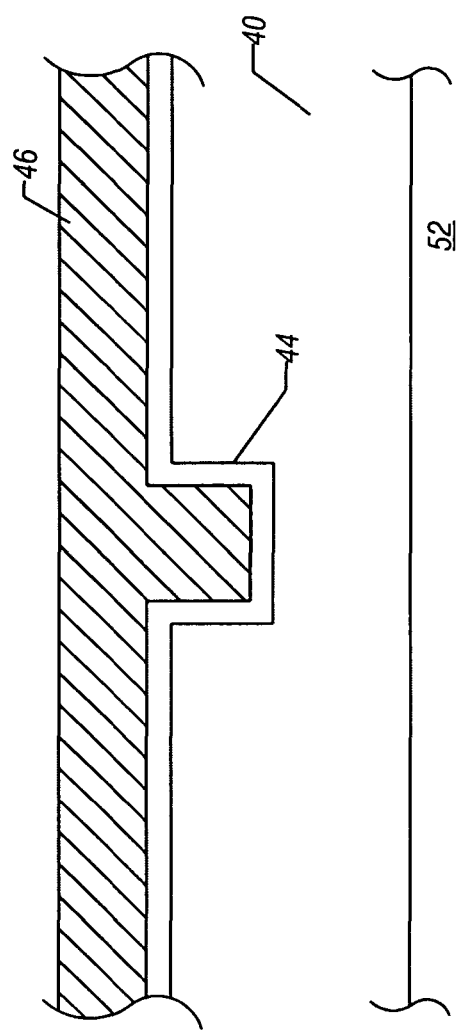
FIG. 4 is an enlarged cross-sectional view of the structure shown in FIG. 3 after further processing in accordance with one embodiment of the present invention.
Figure 5:
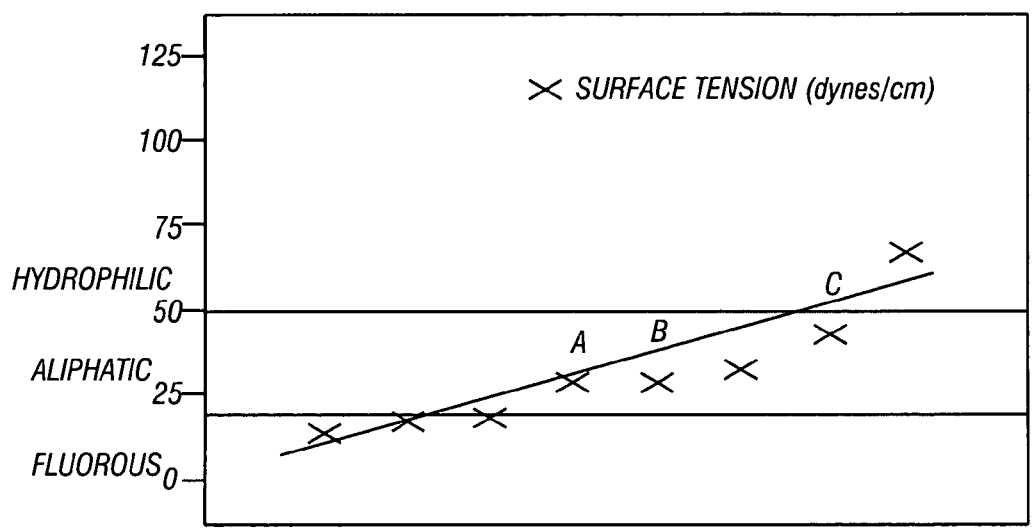
FIG. 5 is a graph of surface energy for materials with and without treatment according to one embodiment of the present invention.

In one embodiment, the surface 40 may be treated in the atmosphere of hexamethyldisilazane (HMDS) saturated nitrogen for 100 seconds at a temperature of 40° C. Following a cooling step, the surface 40 may be spin coated with the sacrificial polymer 46, as shown in FIG. 4, and baked. As shown in FIG. 5, as a result of the surface treatment, the surface energy of the sacrificial material "A" better matches the surface energy of the underlying substrate "B" compared to the substrate surface energy before treatment "C".

Other materials that may be utilized for surface energy modification include alkyl and fluoroalkyl functionalized silylhalides, alkoxysilanes, and nitrogen containing silation agents. With different types of substrates such as SiON, SiOF, carbon doped oxide (CDO), and metal, appropriate surface tension modifying agents may be utilized. These may include self-assembled monolayers (SAMs) formed from precursors including, but not limited to, thiols, sulfides, phosphates, phosphites, alkenes, chelation agents (benzotriazole (BTA), crown ethers, kryptands, cyclodextrins, poly and oligothiophenes, poly and oligoanalines) to mention a few examples.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   treating a substrate to make the treated substrate more hydrophobic by applying a coating to the substrate with a hydrophobic material;
   applying a hydrophobic decomposing film over said coating;
   matching the energy of the decomposing film to the energy of the coating; and
   decomposing said film through the application of heat.

2. The method of claim 1 including making said substrate more hydrophobic using a hexamethyldisilazane atmosphere.

3. The method of claim 2 including using an atmosphere including hexamethyldisilazane saturated nitrogen.

\* \* \* \* \*